(12) United States Patent
Nourbakhsh et al.

(10) Patent No.: US 9,293,536 B2
(45) Date of Patent: Mar. 22, 2016

(54) BILAYER GRAPHENE TUNNELING FIELD EFFECT TRANSISTOR

(71) Applicants: IMEC VZW, Leuven (BE); Katholieke Universiteit Leuven, KU LEUVEN R&D, Leuven (BE)

(72) Inventors: Amirhasan Nourbakhsh, Leuven (BE); Bart Soree, Begijnendijk (BE); Marc Heyns, Linden (BE); Tarun Kumar Agarwal, Leuven (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

(21) Appl. No.: 14/572,364

(22) Filed: Dec. 16, 2014

(65) Prior Publication Data

US 2015/0171167 A1  Jun. 18, 2015

(30) Foreign Application Priority Data

Dec. 18, 2013  (EP) .................................... 13197942
Feb. 6, 2014  (EP) .................................... 14154114

(51) Int. Cl.

| H01L 29/66 | (2006.01) |
|---|---|
| H01L 29/16 | (2006.01) |
| H01L 29/423 | (2006.01) |
| H01L 29/786 | (2006.01) |

(52) U.S. Cl.
CPC ...... *H01L 29/1606* (2013.01); *H01L 29/42384* (2013.01); *H01L 29/78648* (2013.01); *H01L 29/78684* (2013.01); *H01L 29/78696* (2013.01)

(58) Field of Classification Search
CPC ..................... H01L 29/1606; H01L 29/66015; H01L 29/1029
See application file for complete search history.

(56) References Cited

U.S. PATENT DOCUMENTS

| 2011/0089995 A1 | 4/2011 | Heo et al. |
| 2012/0175594 A1* | 7/2012 | Chen .................. H01L 29/4908 257/29 |

FOREIGN PATENT DOCUMENTS

EP  2568506 A1  3/2013

* cited by examiner

*Primary Examiner* — Jae Lee
(74) *Attorney, Agent, or Firm* — Knobbe Martens Olson & Bear, LLP

(57) ABSTRACT

A bilayer graphene tunnelling field effect transistor is provided comprising a bilayer graphene layer, and at least a top gate electrode and a bottom gate electrode, wherein the at least a top gate electrode and a bottom electrode are appropriately positioned relative to one another so that the following regions are electrically induced in the chemically undoped bilayer graphene layer upon appropriate biasing of the gate electrodes: a source region, a channel region, and a drain region.

20 Claims, 11 Drawing Sheets

BILAYER GRAPHENE TUNNELING FIELD EFFECT TRANSISTOR

INCORPORATION BY REFERENCE TO RELATED APPLICATIONS

Any and all priority claims identified in the Application Data Sheet, or any correction thereto, are hereby incorporated by reference under 37 CFR 1.57. This application claims the benefit of EP Appl. No. 13197942.9 filed Dec. 18, 2013 and EP Appl. No. 14154114.4 filed Feb. 6, 2014. Each of the aforementioned applications is incorporated by reference herein in its entirety, and each is hereby expressly made a part of this specification.

TECHNICAL FIELD

The present disclosure relates to semiconductor devices comprising bilayer graphene (BLG) as well as to methods for the manufacturing and operating of such bilayer graphene (BLG) semiconductor devices.

BACKGROUND OF THE DISCLOSURE

Graphene is a 2-dimensional, semi-metallic, atomically-thin film in which carbon atoms are arranged into a $sp^2$ honeycomb lattice structurally relying on in-plane, covalent σ-bonds. It is also chemically stable in non-oxidizing environments, and is mechanically very stiff. Its electronic transport properties have been found to be largely superior to those of materials traditionally employed in microelectronics. More specifically, charge transport and/or charge mobility are important aspects of graphene. Graphene has also the properties of very high mobility at room temperature ($10^4$-$10^6$ cm$^2$ V$^{-1}$ s$^{-1}$). Therefore, graphene is one of the most promising candidates as material for post-CMOS applications.

Single layer graphene (SLG) is a gapless (bandgap-free) semimetal. As a consequence, field effect transistors (FETs) using SLG as active channel exhibit a poor on-current/off current Ion/Ioff ratio (generally ~10), and they cannot be switched off. This is one of the main limiting factors hampering the use of graphene in microelectronics for logic applications.

Bilayer graphene (BLG) consists of two SLG stacked vertically and interacting via their pi-bonds, BLG shares with SLG the zero bandgap character and is therefore a semimetal too. However, a bandgap can be introduced (also often referred to as bandgap opening or bandgap widening) in BLG if the inversion symmetry of the two stacked layers is broken by the use of an external electric field, applied perpendicularly to the BLG plane. BLG then becomes a semiconductor with a bandgap that depends on the strength of the applied electric field. The maximum value of the bandgap that can be induced depends solely on interlayer coupling energy. The bandgap thus obtained is in the range of 0 to 300 meV and results in an on-current/off current Ion/Ioff ratio of the field effect transistor of about 100.

So far, the bandgap opening in BLG by vertical symmetry breaking, as described above, has been achieved in two ways: chemical doping by opening up of the bandgap in BLG by adsorbates or electrical doping by an electric displacement field generated by a gate electrode.

The first approach (i.e. chemical doping), however, is not easily controlled as the dopants tend to spread non-uniformly on the BLG. Furthermore, the dopant tends to migrate and interact with graphene, creating defects leading to device performance stability problems. Also, the deposition of dopants is so far hardly compatible with typical CMOS process flows. Also dopant profile engineering is not sufficient as, due to the weak nature of the interaction of graphene and adsorbates, it is very difficult to achieve homogeneous dopant profiles along the graphene.

In the second approach (i.e. electrical doping), an external gate stack in direct contact with BLG (e.g. a top gate stack) is used to establish an electric displacement field perpendicular to the BLG plane.

The small achievable bandgap and the large band-to-band tunnelling in BLG may be exploited to build tunnelling field effect transistors (further referred to as TFETs), which can result in an even larger Ion/Ioff ratio and a subthreshold swing below that obtained in conventional FETs. A TFET comprises a tunnel barrier, which comprises contiguous a p-type doped, an intrinsic and an n-type doped region (p-i-n) whereas conventional FETs only has p-n regions. The height of the tunnel barrier can be modulated by the TFET gate potential, thereby controlling the transport current of the TFET. Hence the device can be switched on and off by controlling the band bending in the channel region by means of a gate voltage bias.

The operation of such a TFET requires abrupt p-type doped, intrinsic and n-type doped regions. With current state of the art it is very challenging to achieve steep shallow dopant profiles (and thus abrupt p-i-n junctions) which are necessary for sub-100 nm technologies.

There is therefore a need for new BLG TFET architectures allowing inducing an adjustable transverse electrical field sufficiently large to open a band gap in the BLG. In particular this electrical field may be an electric displacement field larger than 3.5 V/nm across the bilayer. There is also a need for creating semiconducting n-i-p (or p-i-n) regions with abrupt junctions. There is also a need in the art for an architecture having a low impact on the structural integrity of graphene and on the stability of the device.

SUMMARY OF THE DISCLOSURE

A bilayer graphene-based semiconductor device having efficient switching is provided.

This aim is achieved with a bilayer graphene tunnelling field effect transistor showing the technical characteristics of the first independent claim.

It is an aim to electrically induce at least a source region, a channel region and a drain region in chemically undoped bilayer graphene.

It is another aim to provide a method for operating such a bilayer graphene tunnelling field effect transistor.

This aim is achieved with a method comprising the steps of the second independent claim.

It is another aim to provide a method for manufacturing such a bilayer graphene tunnelling field effect transistor.

This aim is achieved with a method comprising the steps of the third independent claim.

According to different aspects, a bilayer graphene tunnelling field effect transistor is disclosed comprising at least a source region, a channel region and a drain region which are electrically induced in a (preferably chemically undoped) bilayer graphene layer by appropriate positioning of at least a top and bottom gate electrode relative to one another and by appropriate biasing of the gate electrodes. In other words, according to different aspects, a bilayer graphene tunnelling field effect transistor is disclosed comprising:

a. A bilayer graphene layer, and
b. At least a top and a bottom gate electrode, wherein the at least a top gate electrode and a bottom electrode are appropriately positioned relative to one another so that the following regions are electrically induced in the bilayer graphene layer upon appropriate biasing of the gate electrodes:

i. a source region,
ii. a channel region, and
iii. a drain region.

In embodiments, the bilayer graphene layer may be chemically undoped. It is an advantage of embodiments that a source, a channel and a drain region can be created in a bilayer graphene layer without the need for chemical doping of the bilayer graphene.

In embodiments, appropriate biasing may be applying a voltage of a first polarity to a top electrode and a voltage of a second polarity to a bottom electrode.

In embodiments, the voltage of a first polarity may be similar in magnitude to the voltage of the second polarity (e.g. within 15% or within 12% or within 11%).

According to embodiments, the top gate electrode and the bottom gate electrode may be positioned opposite at both sides of the bilayer graphene layer such that the channel region is electrically induced in a region of the bilayer graphene layer where both the top and bottom gate electrode are present (e.g. in a region of the bilayer graphene layer overlapped by both the top and the bottom gate).

A bilayer graphene semiconductor device (e.g. a tunnelling field effect transistor) is disclosed comprising a bilayer graphene 103 having a bottom surface and a top surface, a bottom gate electrode 121 capacitively coupled to the bottom surface of the bilayer graphene 103, and a first top gate electrode 131, 133 capacitively coupled to the top surface of the bilayer graphene 103, whereby the bottom gate electrode 121 (at least) partially overlaps (D) the first top gate electrode 131, 133 thereby defining a channel region 140 capacitively coupled to the bottom gate electrode 121 and the first top gate electrode 131, 133, a source region 150 only capacitively coupled to the first top gate electrode 131, 133, and a drain region 160 only capacitively coupled to the bottom gate electrode 121.

The bilayer graphene semiconductor may further comprise a second top gate electrode 132 capacitively coupled to the top surface of the bilayer graphene 103, spaced apart (D1) along the top surface from the first top gate electrode 131 whereby, the bottom gate electrode 121 fully overlaps the first top gate electrode 131 and the second top gate electrode 132, thereby defining a channel region 140 capacitively coupled to the bottom gate electrode 121 and the first top gate electrode 131, a source region 150 capacitively coupled to the second top gate electrode 132 and the bottom gate electrode 121, a barrier region 151 only capacitively coupled to the bottom gate electrode 121, and a drain region 160 only capacitively coupled to the bottom gate electrode 121. In embodiments, the barrier region 151 is situated between the source region 150 and the channel region 140. In embodiments, the drain region 160 is contacting the channel region 140 and no other regions of the bilayer graphene.

A bilayer graphene semiconductor device is disclosed comprising a bilayer graphene 103 having a bottom surface and a top surface, a bottom gate electrode 121 capacitively coupled to the bottom surface of the bilayer graphene 103, and a first top gate electrode 131 capacitively coupled to the top surface of the bilayer graphene 103, whereby the gate electrodes are arranged to form a drain region 160 only capacitively coupled to the bottom gate electrode 121, a channel region 140 capacitively coupled to the bottom gate electrode 121 and to the first top gate electrode 131, and a source region 150 only capacitively coupled to the first top gate electrode 131.

The bilayer graphene semiconductor device may further comprise a second top gate electrode 132 capacitively coupled to the top surface of the bilayer graphene 103, spaced apart (D1) along the top surface from the first top gate electrode 131 whereby the gate electrodes are further arranged to form a source region 150 capacitively coupled to the second top gate electrode 132 and the bottom gate electrode 121, and a barrier region 151, in between the channel region 140 and the source region 150, only capacitively coupled to the bottom gate electrode 121.

According to a first aspect, a bilayer graphene semiconductor device is disclosed, the graphene semiconductor device comprising a first gate dielectric layer 111 on a substrate 100; a bilayer graphene 103, the bilayer graphene comprising a first 101 and a second 102 adjoining graphene layer, the bilayer graphene 103 sandwiched in between with the first gate dielectric layer 111 and a second gate dielectric layer 112, the first gate dielectric layer 111 contacting the first graphene layer 101 and the second gate dielectric layer 112 contacting the second graphene layer 102; the bilayer graphene layer being chemically undoped; a top gate electrode 133 contacting the second gate dielectric layer 112 opposite to the second graphene layer 102; a bottom gate electrode 121 contacting the first gate dielectric layer 111 opposite to the first graphene layer 101; the bottom gate electrode 121 being displaced relatively to the top gate electrode 133 thereby defining an overlapping region over a distance D and a non-overlapping region of the bilayer graphene; the bilayer graphene 103 further comprising in the longitudinal direction a source region 150, a channel region 140 and a drain region 160, the channel region 140 adjacent the source region 150 at one side and adjacent the drain region 160 at the other side; the channel region 140 being the overlapping region of the bilayer graphene which is sandwiched between the top gate electrode 133 and the bottom gate electrode 121; the source region 150 being the non-overlapping region of the bilayer graphene contacted only by the top gate electrode 133; the drain region 160 being the non-overlapping region of the bilayer graphene contacted only by the bottom gate electrode 121.

According to embodiments of the first aspect the bottom gate electrode 121 may be embedded in the substrate 100. The substrate 100 may comprise a semiconductor layer 100a with a bottom dielectric layer 100b on top in which the bottom gate electrode 121 is embedded. The bottom gate electrode 121 is embedded in the dielectric layer 100b, the bottom gate electrode 121 having a top surface and the bottom dielectric layer 100b having a top dielectric surface, wherein the top surface of the bottom gate electrode 121 is coplanar with the top dielectric surface of the bottom dielectric layer 100b.

According to embodiments of the first aspect the top gate electrode 133 may be covered by a top dielectric layer 100c. The drain region 160 is sandwiched in between the bottom gate electrode 121 and part of the top dielectric layer 100c.

According to embodiments of the first aspect the top gate electrode 133 and the bottom gate electrode 121 may be biased separately by a top gate electrode contact 233 and a bottom gate electrode contact 221 respectively.

According to embodiments of the first aspect the source region 150 and the drain region 160 may be biased by a source contact 251 and a drain contact 252 respectively.

According to embodiments of the first aspect the top gate electrode 133 and the bottom gate electrode 121 are oppositely biased in the OFF-state thereby electrically inducing a source region which is oppositely doped compared to the drain region and an intrinsically doped channel region. By oppositely biasing the top gate electrode 133 and the bottom gate electrode 121 in the OFF-state the bilayer graphene becomes thus electrically doped.

When applying a positive bias to the top gate electrode 133 and a negative bias to the bottom gate electrode 121 in the OFF-state, a p-type source region and n-type drain region is induced. The channel region is intrinsically doped/undoped.

When applying a negative bias to the top gate electrode 133 and a positive bias to the bottom gate electrode 121 in the OFF-state, an n-type source region and p-type drain region is induced. The channel region is intrinsically doped/undoped, i.e. i-type.

According to embodiments, for a symmetric device (i.e. when the equivalent oxide thickness EOT of the first and second gate dielectric layer is the same), the top gate electrode 133 and the bottom gate electrode 121 may be biased with voltages of opposite signs and substantially equal absolute values. The voltages actually measured at the top gate electrode 133 and at the bottom gate electrode 121 will only be substantially equal if measured when the source-drain voltage Vds is very small (i.e. for Vds tending to zero or actually equal to zero). In embodiments, the top gate electrode 133 and the bottom gate electrode 121 may be biased with voltages of opposite signs and within 10%, preferably within 5%, yet more preferably within 2%, even more preferably within 1% of one another. Most preferably, the top gate electrode 133 and the bottom gate electrode 121 may be biased with voltages of opposite signs and equal absolute values.

In practice however, the Vds applied is typically not negligible and even if the same voltage is imposed to both the top gate electrode 133 and the bottom gate electrode 121, a mismatch between the voltage measured for the top gate electrode 133 and for the bottom gate electrode 121 may develop, leading to voltages of opposite signs and absolute values which may for instance lay within 15% (or within 12% or within 11%) of one another.

According to embodiments, for a symmetric device, i.e. when the equivalent oxide thickness EOT of the first and second gate dielectric layer is the same, the top gate electrode 133 and the bottom gate electrode 121 are oppositely biased in the OFF-state with an OFF-state voltage $V_{OFF}$ and $-V_{OFF}$ respectively.

According to embodiments the bilayer graphene TFET may be switched from ON-state to OFF-state by applying an additional supply voltage $V_{dd}$ to the OFF-state bias $V_{OFF}$ to one of the gate electrodes such that a shift of the conduction energy band in the channel region occurs. In embodiments, this additional supply voltage $V_{dd}$ may represent from 20 to 90% of $V_{OFF}$, preferably from 22 to 80% of $V_{OFF}$, more preferably from 25 to 70% of $V_{OFF}$, yet more preferably from 30 to 60% of $V_{OFF}$, and most preferably from 35 to 50% of $V_{OFF}$. For instance $V_{dd}$ may be 50% of $V_{OFF}$. However, $V_{dd}$ is preferably less than 50% of $V_{OFF}$.

According to embodiments of the first aspect in the ON-state the top gate electrode 133 is biased with a voltage $V_{ON}=(V_{OFF}+V_{dd})$, $V_{dd}$ being a supply voltage which is additionally added to the OFF state voltage $V_{OFF}$, thereby inducing a shift of the conduction energy band in the channel region 140 and increasing the tunneling probability of electrons from the source region 150 to the drain region 160. Thereby the i-type channel region 140 in the OFF state changes to a doped channel region 140 with a doping type similar to the doping type of the source region 150. In the ON state the voltage applied to the bottom gate electrode 121 remains unchanged compared to the voltage applied in the OFF-state.

According to a second aspect, a method for operating a bilayer graphene semiconductor device is disclosed, the method comprising electrostatically inducing a p-i-n junction or n-i-p junction in the bilayer graphene.

According to embodiments of the second aspect, electrostatically inducing a p-i-n junction comprises applying a first voltage to the top gate electrode 133 and a second voltage of opposite sign to the bottom gate electrode 121. The absolute value of the applied first voltage and the applied second voltage are preferably substantially equal if measured when the source-drain voltage Vds is very small (i.e. for Vds tending to zero or actually equal to zero). In embodiments, the top gate electrode 133 and the bottom gate electrode 121 may be biased with voltages of opposite signs and within 10%, preferably within 5%, yet more preferably within 2%, even more preferably within 1% of one another. Most preferably, the top gate electrode 133 and the bottom gate electrode 121 may be biased with voltages of opposite signs and equal absolute values.

In practice however, the Vds applied is typically not negligible and even if the same voltage is imposed to both the top gate electrode 133 and the bottom gate electrode 121, a mismatch between the voltage measured for the top gate electrode 133 and for the bottom gate electrode 121 may develop, leading to voltages of opposite signs and absolute values which may for instance lay within 15% (or within 12% or within 11%) of one another.

According to embodiments of the second aspect, electrostatically inducing a p-i-n junction comprises applying a voltage to the top gate electrode 133 and a voltage of opposite sign (e.g. the opposite voltage) to the bottom gate electrode 121. For inducing a p-type source and n-type drain the voltage applied to the top gate electrode 133 will be positive (and thus to the bottom gate electrode 121 the voltage will be negative). For inducing an n-type source and p-type drain the voltage applied to the top gate electrode 133 will be negative (and thus to the bottom gate electrode 121 the voltage will be positive). One possible embodiment discloses a voltage to the bottom gate electrode 121 Vbias (Vbg) kept constant in OFF and ON state of the device and a non-constant voltage $V_t$ (Vtg) at the top gate electrode 133. The bottom gate electrode 121 is thus kept at constant voltage of Vbias and top gate electrode 133 is thus switching the device between "ON" and "OFF" state. The OFF state or the state with the lowest current in the device corresponds to when top gate electrode 133 is biased with a voltage $V_{OFF}=-V_{bias}$. Further, the ON state of the device (FIG. 3) corresponds to when the top gate electrode 133 is biased with a voltage equal to $V_{ON}=(V_{OFF}+V_{DD})$ wherein $V_{DD}$ is an additional supply voltage.

For a person skilled in the art it is clear that for inducing a n-i-p junction according to the second aspect analogue voltages may be applied to the device as for the p-i-n junction except for changing the polarity of the voltage (i.e. a positive bias becomes negative and vice versa).

According to a third aspect, a bilayer graphene semiconductor device is disclosed, the graphene semiconductor device comprising a first gate dielectric layer 111 on a substrate 100; a bilayer graphene 103, the bilayer graphene comprising a first 101 and a second 102 adjoining graphene layer, the bilayer graphene 103 sandwiched in between the first gate dielectric layer 111 and a second gate dielectric layer 112, the first gate dielectric layer 111 contacting the first graphene layer 101 and the second gate dielectric layer 112 contacting the second graphene layer 102; the bilayer graphene layer being chemically undoped; a bottom gate electrode 121 contacting the first gate dielectric layer 111 opposite to the first graphene layer 101; opposite the bottom gate electrode 121 a first top gate electrode 131 contacting the second gate dielectric layer 112 opposite to the second graphene layer 102 and a second top gate electrode 132 contacting the second gate dielectric layer 112 opposite to the second graphene layer 102, the second top gate electrode 132 positioned at a distance D1 from the first top gate electrode 131; the bilayer graphene 103 comprising in the longitudinal direction a source region 150, a barrier region 151, a channel region 140 and a drain region 160, the channel region 140 adjacent the barrier region 151 at one side and adjacent the drain region 160 at the other side, the barrier region 151 adjacent the source region 150 at the other side; the channel region 140 being the region which is sandwiched between the bottom gate electrode 121 and the first top gate electrode 131; the source region 150 being the region which is sandwiched between the bottom gate electrode 121 and the second top gate electrode 132; the drain region 160 being the region which is contacted by only the bottom gate electrode 121 and the barrier region being the region with the distance D1 (e.g. of dimension D1) which is contacted by only the bottom gate electrode 121.

According to embodiments of the third aspect the bottom gate electrode 121 may be embedded in the substrate 100. The substrate 100 may comprise a semiconductor layer 100a with a bottom dielectric layer 100b on top in which the bottom gate electrode 121 is embedded. The bottom gate electrode 121 is embedded in the dielectric layer 100b, the bottom gate electrode 121 having a top surface and the bottom dielectric layer 100b having a top dielectric surface, wherein the top surface of the bottom gate electrode 121 is coplanar with the top dielectric surface of the bottom dielectric layer 100b.

According to embodiments of the third aspect the first 131 and second 132 top gate electrode may be covered by a top dielectric layer 100c. The drain region 160 and the barrier region 151 are then sandwiched in between the bottom gate electrode 121 and part of the top dielectric layer 100c.

According to embodiments of the third aspect the bottom gate electrode 121 and the first and second top gate electrode 131, 132 may be biased separately by a bottom gate electrode contact 221, a first 231 a second 232 top gate electrode contact respectively.

According to embodiments of the third aspect the source region 150 and the drain region 160 may be biased by a source contact 251 and a drain contact 252 respectively.

According to embodiments of the third aspect the bottom gate electrode 121 and the second top gate electrode 132 are oppositely biased in the OFF-state and in the ON-state.

According to embodiments of the third aspect the bottom gate electrode 121 and the first top gate electrode 131 are oppositely biased in the OFF-state and in the ON-state.

According to embodiments of the third aspect the first gate dielectric layer 111 and the second gate dielectric layer 112 have the same equivalent oxide thickness EOT.

For a bilayer graphene semiconductor device according to embodiments of the third aspect with the same EOT for both the first gate dielectric layer 111 and the second gate dielectric layer 112 the absolute value of the voltage applied to the bottom gate electrode 121 is smaller than the (absolute value of the) voltage applied to the second top gate electrode 132.

According to embodiments of the third aspect the absolute value of the voltage applied to the bottom gate electrode 121 is comparable to the (absolute value of the) voltage applied to the first top gate electrode 131 in the OFF-state, thereby inducing an intrinsic channel region 140, i.e., i-type channel region 140. For instance, the absolute value of the voltage applied to the bottom gate electrode 121 may be within 10%, preferably within 5%, yet more preferably within 2%, even more preferably within 1% of one another wherein the voltage applied is measured with a Vds close to zero or equal to zero. In practice however, the Vds applied is typically not negligible and even if the same voltage (in absolute value) is imposed to both the top gate electrode 131 and the bottom gate electrode 121, a mismatch between the voltage measured for the top gate electrode 131 and for the bottom gate electrode 121 may develop, leading to voltages of opposite signs and absolute values which may for instance lay within 15% (or within 12% or within 11%) of one another.

According to embodiments of the third aspect an additional supply voltage is applied to the first top gate electrode 131 in the ON-state, thereby inducing a shift of the conduction energy band in the channel region 140 and increasing the tunneling probability of electrons from the source region 150 to the drain region 160. Thereby the i-type channel region 140 in the OFF state changes to a doped channel region 140 (in the ON state) with a doping type similar to the doping type of the barrier region 151 and the drain region 150. In the ON state the voltage applied to the bottom gate electrode 121 and the voltage applied to the second top gate electrode 132 remains unchanged compared to the voltage applied in the OFF-state. In embodiments, this additional supply voltage $V_{dd}$ may represent from 20 to 90% of $V_{OFF}$, preferably from 22 to 80% of $V_{OFF}$, more preferably from 25 to 70% of $V_{OFF}$, yet more preferably from 30 to 60% of $V_{OFF}$, and most preferably from 35 to 50% of $V_{OFF}$. For instance $V_{dd}$ may be 50% of $V_{OFF}$. However, $V_{dd}$ is preferably less than 50% of $V_{OFF}$.

According to a fourth aspect, a method for operating a bilayer graphene semiconductor device is disclosed, the method comprising electrostatically inducing a p-n-i-n junction or n-p-i-p junction in the bilayer graphene.

According to embodiments of the fourth aspect, electrostatically inducing a p-n-i-n junction further comprises applying a constant bias Vbg to the bottom gate electrode 121, applying a bias Vtg2 (wherein |Vtg2|>|Vbg| an wherein the sign of Vtg2 is opposite to the sign of Vbg) to the second top gate electrode 132 to create the p-type source region 150 and applying a voltage Vtg1 (wherein |Vtg1|~|Vbg|) and wherein the sign of Vtg1 is opposite to the sign of Vbg) to create an intrinsic channel region 140 in the bilayer graphene 103. Preferably, |Vtg2| is larger than |Vbg| by from 20 to 90%, preferably by from 22 to 80%, more preferably by from 25 to 70%, yet more preferably by from 30 to 60%, and most preferably by from 35 to 50%. By |Vtg1|~|Vbg|, it is meant that |Vtg1| is similar to |Vbg|. For instance, |Vtg1| may be within 10%, preferably within 5%, yet more preferably within 2%, even more preferably within 1% of one another when the voltage applied is measured with a Vds close to zero or equal to zero. Most preferably, |Vtg1| is equal to |Vbg|. In practice however, the Vds applied is typically not negligible and even if the same voltage (in absolute value) is imposed to both the top gate electrode 131 and the bottom gate electrode 121, a mismatch between the voltage measured for the top gate electrode 131 and for the bottom gate electrode 121 may develop, leading to voltages of opposite signs and measured absolute values which may for instance lay within 15% (or within 12% or within 11%) of one another.

A continuous bottom gate voltage to the bottom gate electrode 121 is used to open up the band gap in the bilayer graphene 103. The bottom gate electrode 121 is kept at a constant bias voltage (+Vbg). The second top gate (132; TG2) is biased at Vtg2 (wherein |Vtg2|>|Vbg| and wherein the sign of Vtg2 is opposite to the sign of Vbg) to create a p-type source region 150 (similar to the biasing in the OFF state), while the first top gate electrode (131; TG1) is biased at Vtg1 (wherein |Vtg1|~|Vbg| and wherein the sign of Vtg1 is opposite to the sign of Vbg) to create an intrinsic channel region 140 in the bilayer graphene 103. The voltage applied at the bottom gate electrode 121 and at the second top gate electrode 132 is kept at a constant voltage of Vbg and Vtg2 (of opposite sign) respectively. The first top gate electrode 131 is responsible for switching the device to "ON" and "OFF" state. The OFF state or lowest current in the device corresponds to when the first top gate electrode 133 has a voltage $V_{OFF}$=(Vtg1). The ON state of the device corresponds to when the first top gate electrode 131 has a voltage equal to $V_{ON}$=($V_{OFF}$+$V_{DD}$) wherein $V_{DD}$ is an additional supply voltage as defined in the first aspect.

For a person skilled in the art it is clear that for inducing a n-p-i-p junction according to the fourth aspect analogue voltages may be applied to the device as for the p-n-i-n junction except for changing the polarity of the voltage (i.e. a positive bias becomes negative and vice versa).

According to a fifth aspect, a method for fabricating a bilayer graphene semiconductor device is disclosed, the method comprising the steps of:

Providing a bottom dielectric layer on a semiconducting layer;

Patterning the bottom dielectric layer thereby forming at least one trench;

Providing a conducting bottom gate material in the at least one trench thereby forming at least one bottom gate electrode;

Providing a first gate dielectric layer on the bottom dielectric layer and the conducting bottom gate material;

Providing a chemically undoped bilayer graphene on the first gate dielectric layer;

Providing a second gate dielectric layer on the chemically undoped bilayer graphene;

Providing a conducting top gate material on at least part of the second gate dielectric layer (thereby forming a top gate electrode);

Providing electrical contacts.

It is an advantage of embodiments that a bilayer graphene-based semiconductor device can be obtained that exhibits a good $I_{on}/I_{off}$ ratio (e.g. $10^4$ or more).

It is an advantage of embodiments that a bilayer graphene-based semiconductor device can be obtained that exhibits a subthreshold swing lower than 60 mV/dec.

It is an advantage of embodiments that a bilayer graphene-based semiconductor device can be obtained that can be effectively switched off via a relatively low change in the electric displacement field.

It is an advantage of embodiments that a bilayer graphene-based semiconductor device can be obtained that exhibit a permanent band-gap of at least 100 meV in absence of external potential applied at a top and/or bottom gate and a band-gap of at least 300 meV in presence of such an external potential.

It is an advantage of embodiments that a bilayer graphene-based semiconductor device can be obtained that can exhibit a bandgap of at least 300 meV via the application of an electric field smaller than 3.5 V/nm.

It is an advantage of embodiments that a bilayer graphene-based semiconductor device can be obtained that exhibit a charge density in the bilayer graphene below $10^{13}$ cm$^{-2}$, thereby permitting the switching off of the device via a relatively low external electric displacement field.

It is an advantage of embodiments that a bilayer graphene-based semiconductor device can be obtained wherein the doping level of the bilayer graphene can be easily controlled.

It is an advantage of embodiments that the geometry op the doping profile can be controlled precisely with electrically induced p-doped (and/or n-doped) regions.

It is an advantage of embodiments that a bilayer graphene-based semiconductor device can be obtained wherein the doping regions with abrupt junctions are present in the bilayer graphene.

It is an advantage of embodiments that a bilayer graphene-based semiconductor device can be obtained wherein the doping on the bilayer graphene can be uniform.

It is an advantage of embodiments that a bilayer graphene-based semiconductor device can be obtained via a method compatible with typical CMOS process flows.

It is an advantage of embodiments that a bilayer graphene-based semiconductor device can be obtained which is passivated and/or which permits gating of the device.

It is an advantage of embodiments that a bilayer graphene-based semiconductor device can be obtained via a method enabling good control of the dopant concentration and of the junction profile.

Figure 1:
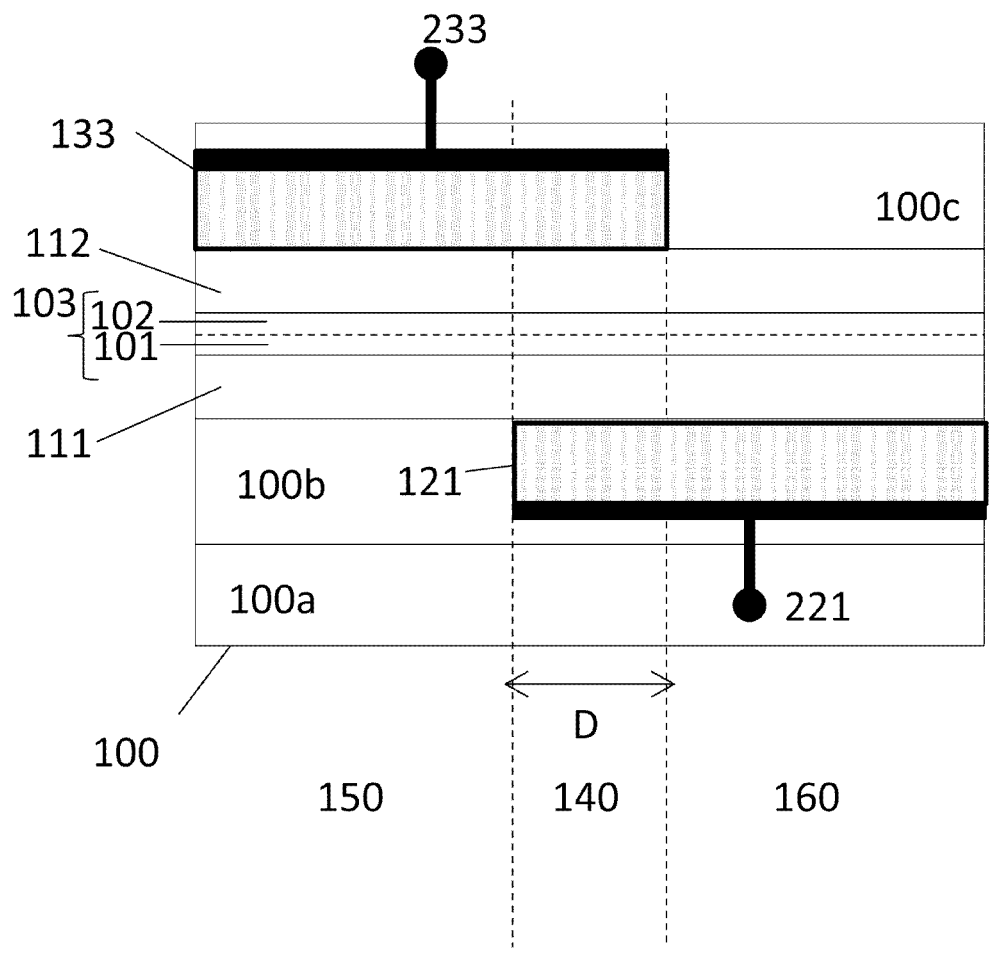
FIG. 1 shows schematically a BLG TFET according to a first aspect.

Although the specific features of the embodiments herein are shown in some drawings and not in others. This is done for convenience only as each feature may be combined with any or all of the other features in accordance with the embodiments herein.

DETAILED DESCRIPTION OF DIFFERENT EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

If reference is made to the term "horizontal direction", "vertical direction" or "longitudinal direction", the direction is defined relative to the substrate surface. A vertical direction is the direction orthogonal to the substrate surface and orthogonal to the bilayer graphene layer. For this disclosure the vertical direction is thus defined along the height of the semiconductor device (which is in the plane of the paper surface, from top to bottom and vice versa). A longitudinal direction is the direction parallel with the substrate surface and orthogonal to the vertical direction. For this disclosure the longitudinal direction is defined along the length of the bilayer graphene layer (which is in the plane of the paper surface, from left to right and vice versa). A horizontal direction is the direction parallel with the substrate surface and orthogonal to the longitudinal direction and orthogonal to the vertical direction. For this disclosure the horizontal direction is defined along the width of the bilayer graphene layer (which is in direction orthogonal to the paper surface).

A way to overcome the disadvantages of chemically induced p-n junctions in bilayer graphene semiconductor devices is provided. These p- and n-type regions can be induced solely electrically via electrostatic biased gate electrodes. The BLG do not need to be chemically doped during the manufacturing thereof.

By positioning a bottom gate stack and at least one top gate stack in direct contact with the BLG, an electric displacement field may be established perpendicular to the BLG plane. The induced electrical displacement field locally dopes the BLG by inducing different excess charge densities of the same sign in the two layers of BLG, thereby inducing a charge density asymmetry between these two layers. The Coulomb interaction between the two asymmetric charge densities causes the opening of the band gap between the conductance and valence energy bands in the BLG band diagram.

In contrast to BLG with chemically doped n- and p-doped regions, the geometry of the doping profile can be controlled precisely with an electrically induced p-doped (and/or n-doped) region as disclosed in embodiments of the different aspects.

In the following two examples will be disclosed according to embodiments of certain aspects.

Simulations are carried out using self-consistent solution of the 3D Poisson and Schrodinger equations within non equilibrium Green's function (NEGF), implemented in the open source code NanoTCAD ViDES.

Two symmetric (i.e. when the equivalent oxide thickness EOT of the first and second gate dielectric layer is the same) device structures are disclosed which differ in the location/positioning of the gate electrodes.

FIGS. 1-4 relate to a dual gate bilayer graphene TFET with displaced gate electrodes and will now be described in more detail.

FIG. 1 schematically shows the BLG device according to a first aspect. The BLG device is a dual gate bilayer graphene semiconductor device with displaced gate electrodes. The BLG device comprises a bilayer graphene 103. The bilayer graphene comprises a first 101 graphene layer and a second adjoining, graphene layer 102. Adjoining means there is a direct contact between the first graphene layer 101 and the second graphene layer 102. The bilayer graphene 103 is capacitively coupled to a bottom gate electrode 121 and a top gate electrode 133. The bilayer graphene 103 is moreover partially sandwiched in between the two gate electrodes 121, 133 positioned on opposite surfaces of the bilayer graphene 103.

A top gate electrode 133 is located on top of the BLG 103 and a bottom gate electrode 121 is located under the BLG, opposite to the top gate electrode 133. The top 133 and bottom 121 gate electrodes are separated from the BLG by a first gate dielectric layer 111 and a second gate dielectric layer 112 respectively. The bottom gate electrode 121 is preferably embedded in a bottom dielectric layer 100b, whereby the surface of the dielectric layer 100b is in contact with the second gate dielectric 111 and is coplanar with the surface of the bottom gate electrode 221. In between the bottom gate electrode 121 and the first graphene layer 101 of the BLG a first gate dielectric layer 111 is present. In between the top gate electrode 133 and the second graphene layer 102 of the BLG a second gate dielectric layer 112 is present. The first and/or second gate dielectric layer 111, 112 may comprise a high-k dielectric material such as $HfO_2$, $ZrO_2$, $Al_2O_3$, $TiO_2$, $La_2O_3$, $SrTiO_3$, $LaAlO_3$, hafnium silicates, barium-strontium-titanates (STs), lead-zircon-titanates (PZTs), or organic high-k dielectric materials. Via the first and second gate dielectric layer 111, 112 respectively the bottom and top gate electrode 133, 133 are capacitively coupled to the BLG, i.e. to the first and the second graphene layer 101, 102 respectively.

The bottom and top gate electrode 121, 133 are displaced relatively to each other over a horizontal distance, thereby defining/creating three regions/parts for the BLG semiconductor device. Due to the displacement over the horizontal distance, three regions/parts can be distinguished in the BLG layer 103, differing in which gate electrodes overlaps which part. A first part of the BLG forms the source region 150 of the BLG semiconductor device. This part of the BLG is only contacted by (or capacitively coupled with) a part of the top gate electrode 133. A second part of the BLG forms the drain region 160 of the BLG semiconductor device. This part of the BLG is only contacted by (or capacitively coupled with) a part of the bottom gate electrode 121. A third part of the BLG defines the channel region 140 of the BLG semiconductor device. This part of the BLG is sandwiched in between another part of the top gate electrode 133 and another part of the bottom gate electrode 121. The channel region 140 has a width equal to the horizontal distance D as it is that part of the BLG which is sandwiched in between the overlapping parts of the top gate electrode 133 and the bottom gate electrode 121.

The bottom gate electrode 121 may be biased via a bottom gate electrode contact 221. The top gate electrode 133 may be biased via a top gate electrode contact 233. Top and bottom gate may be biased separately.

In the OFF state, the top gate electrode contact 133 should be biased according to a first polarity, for example negatively, V(TG)<0V and the bottom gate electrode 121 should be oppositely biased compared to the top gate electrode 133 to a second polarity opposite to the first polarity, for example positively, V(BG)>0V. This biasing scheme divides the valence 501 and conduction 502 band into three regions along the charge transport direction (i.e. the longitudinal direction): (I) an n-type region which defines the source region 150, (II) an intrinsic region which defines the channel region 140, (III) a p-type region which defines the drain region 160.

It should be noted that a person skilled in the art could easily adapt the signs of the bias voltages (polarities) such that opposite electrically doped types are induced in the BLG, i.e. p-type source region, intrinsic channel region and n-type drain region.

By biasing the top 133 gate electrode and the bottom 121 gate electrode, electrically doped regions may be induced in the chemically un-doped BLG. By additionally adding a supply voltage to one of the gates, i.e., by increasing the voltage difference over the channel region, one can induce a further shift in the channel region and thereby change the device from OFF-state to ON-state.

Figure 2:
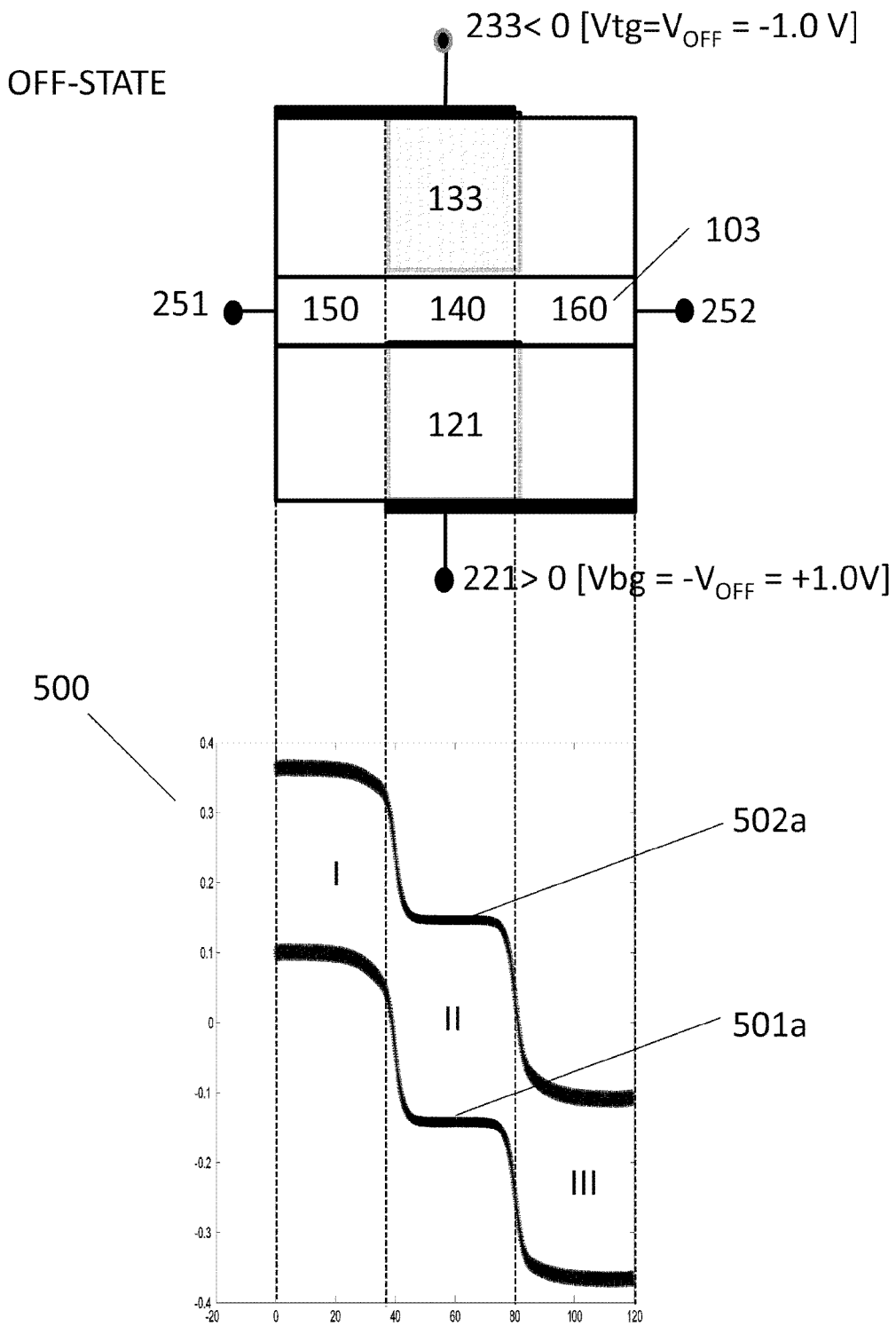
FIG. 2 shows schematically a biased BLG TFET according to embodiments of the first aspect (top) and the corresponding band diagram scheme of the BLG TFET (bottom) in the OFF state.

FIG. 2 shows schematically (top) a biased BLG semiconductor device according to embodiments of the first aspect and (bottom) the corresponding band diagram scheme of the BLG in the OFF state. The band diagram scheme shows the energy levels (eV) in function of the distance of the BLG semiconductor device. In other words, the band diagram scheme shows the energy levels (eV) in function of the distance along the BLG semiconductor device. As the device is OFF, no current flows from between the contact 251 of the source region 150 via the channel region 140 to the contact 252 of the drain region 160. The band diagram scheme 500 shows the energy levels of the valence band 501a and the conduction band 502a of the BLG over the total distance of the BLG device, i.e., from the source region 150, through the channel region 140 to the drain region 160. A V(TG)=−1V and a V(BG)=+1V is applied to the top gate electrode contact 233 and the bottom gate electrode contact 221 respectively.

Figure 3:
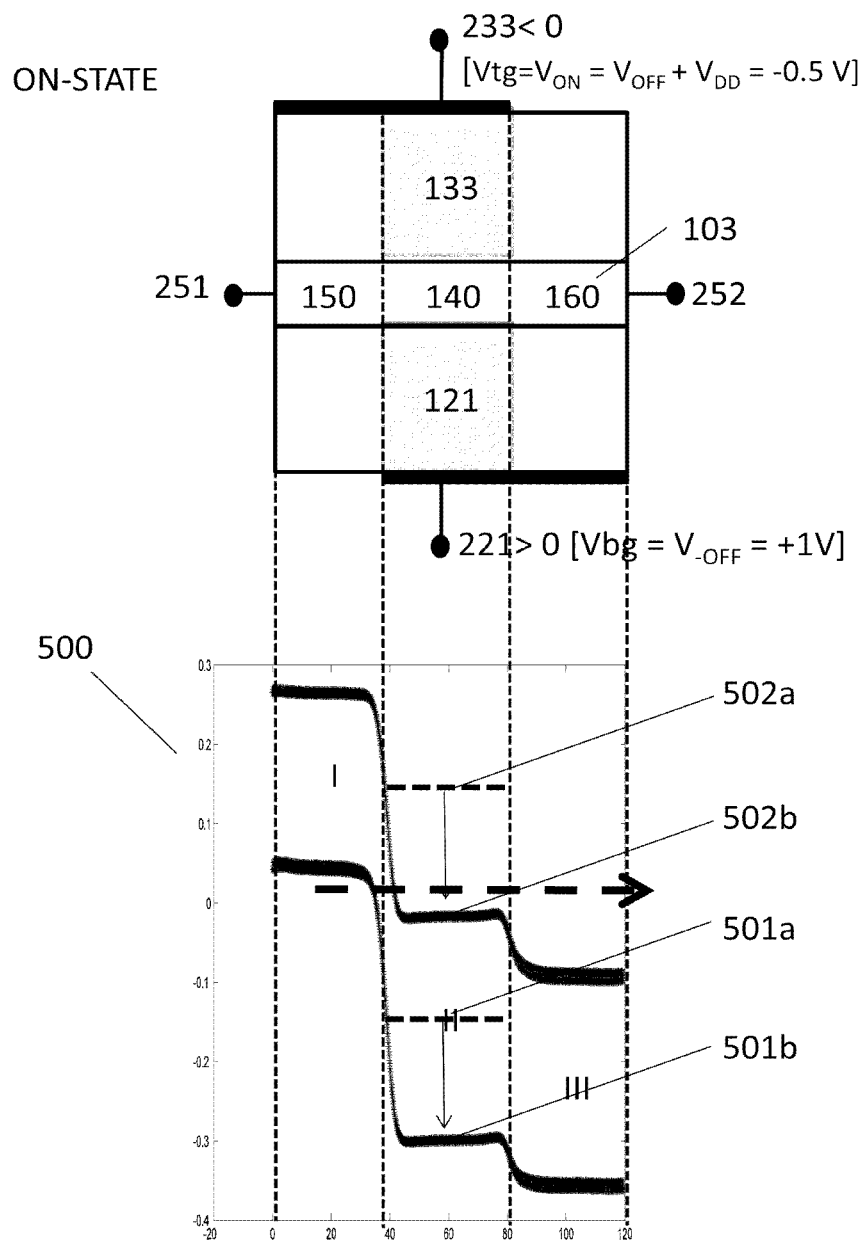
FIG. 3 shows schematically a biased BLG TFET according to embodiments of the first aspect (top) and the corresponding band diagram scheme of the BLG TFET (bottom) in the ON state.

FIG. 3 shows schematically (top) a biased BLG semiconductor device according to embodiments of the first aspect and (bottom) the corresponding band diagram scheme of the BLG in the ON state. As the device is ON, current can flow from the source region 150 via the channel region 140 to the drain region 160. The band diagram scheme 500 shows the energy levels of the valence band 501 of the BLG and the conduction band 502 of the BLG over the total distance of the BLG device, i.e., over the source region 150, the channel region 140 and the drain region 160.

In the ON state, the top gate electrode contact 233 is additionally biased by a positive supply voltage Vdd. V(TG) becomes thus less negative compared to V(TG) in the OFF state. The bottom gate electrode 121 is oppositely biased compared to the top gate electrode 133, thus should be positively biased. Preferably the bottom gate electrode 121 is equally biased as the voltage used in the OFF state: V(BG) >0V. Due to the additional supply voltage Vdd, the conduction and valence band in the channel region 140, II are lowered and the band gap (see shift from 501a to 501b and shift from 502a to 502b) is opened thereby enabling current to flow from the source to the drain as indicated by the dotted arrow. In the source and drain region the conduction and valence band remain unchanged when applying the additional supply voltage Vdd. Otherwise the: in the OFF and ON state the valence and conduction band in the source region and drain region remain the same. It is only in the region which is from both sides oppositely biased, that a shift of the energy bands occurs thereby opening the band gap of the BLG and as a consequence band-to-band tunneling may occur.

A Vtg=−0.5V and a Vbg=+1 V is applied to the top gate electrode contact 233 and the bottom gate electrode contact 221 respectively. For this specific example an N-type TFET comprising an n-type source region and a p-type drain region is electrically induced.

By inversing the polarity of the voltages applied, a person skilled in the art may easily adapt the biasing scheme in order induce a p-type source region and an n-type drain region (P-type MOSFET).

Figure 4:
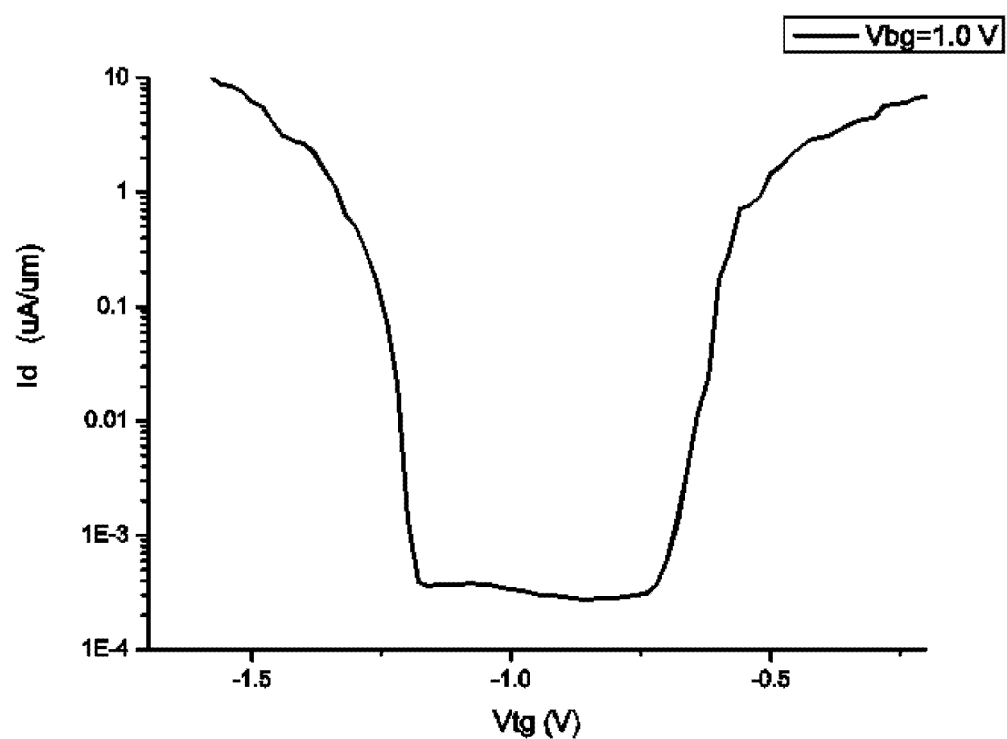
FIG. 4 shows the transfer characteristics for a BLG TFET according embodiments of the first aspect in the ON-state.

FIG. 4 shows the transfer characteristics for a BLG semiconductor device according embodiments of the first aspect. The drain current (Id) is plotted in function of the voltage Vtg applied to the top gate electrode with a constant bottom gate bias Vbg of 1 V. The device is embedded between 3 nm thick dielectric layers 100b, 100c. The length of the top gate electrode 133 and of the bottom gate electrode 121 is 80 nm. They are displaced relatively from each other such that there is an overlapping horizontal distance D of 40 nm. The device has an on-current $I_{ON}$ of about 10 µA/µm for a source-drain voltage ($V_{ds}$) of 10 mV. The $I_{ON}/I_{OFF}$ ratio is more than $10^4$ and the sub-threshold slope SS is below the theoretical SS of 60 mV/dec.

FIGS. 5-8 relate to triple gate bilayer graphene TFET with spaced apart gate electrodes and will now be described in more detail.

Figure 5:
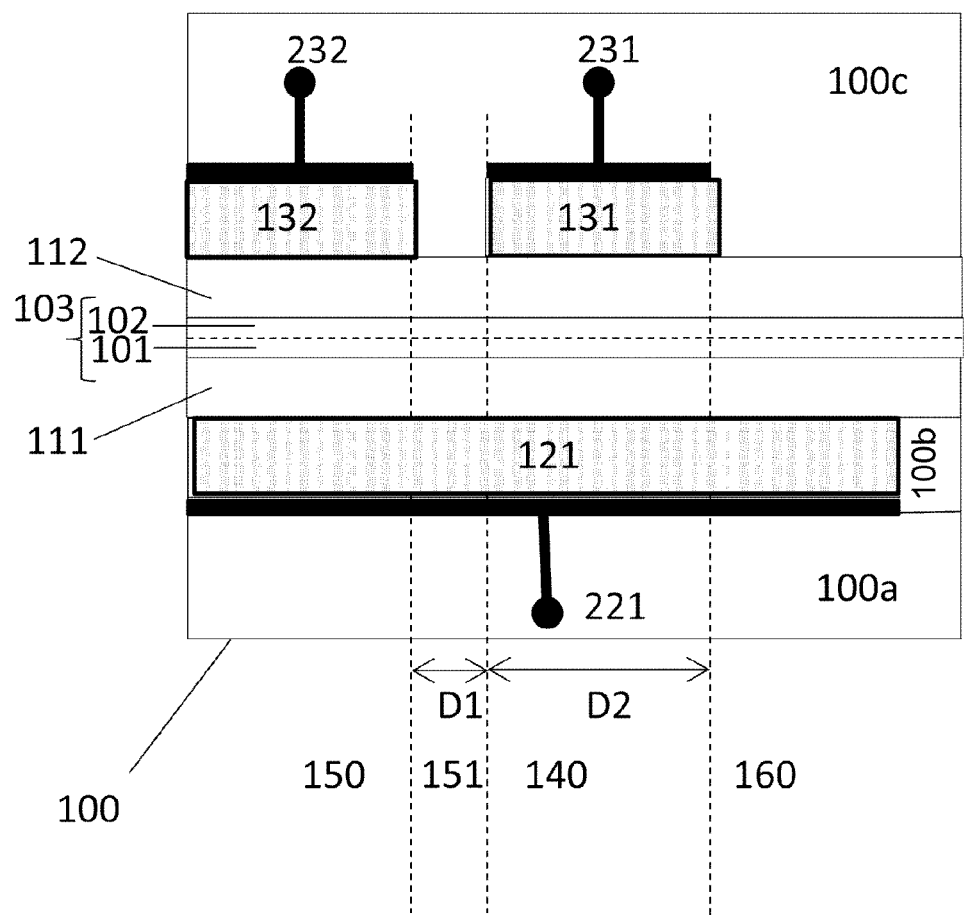
FIG. 5 shows schematically a BLG TFET according to a third aspect.

FIG. 5 schematically shows the BLG device according to a third aspect. BLG device is a triple_gate bilayer graphene semiconductor device with displaced gate electrodes. The BLG device structure comprises a bilayer graphene 103 sandwiched in between one bottom gate electrode (121) and two top gate electrodes 131, 132. The bilayer graphene 103 comprising a first 101 and a second 102 adjoining graphene layer.

The bottom gate electrode 121 is located below the BLG 103 and the two top gate electrodes 131, 132 are located on top of the BLG, opposite to the bottom gate electrode 121. The bottom 121 and top 131,132 gate electrodes are separated from the BLG by a first gate dielectric layer 111 and a second gate dielectric layer 112 respectively. The bottom gate electrode 121 is preferably embedded in a bottom dielectric layer 100b, whereby the surface of the dielectric layer 100b is in contact with the second gate dielectric 111 and is coplanar with the surface of the bottom gate electrode 121. In between the top gate electrodes 131, 132 and the second graphene layer 102 of the BLG a second gate dielectric layer 112 is present. In between the bottom gate electrode 121 and the first graphene layer 101 of the BLG a first gate dielectric layer 111 is present. The first and/or second gate dielectric layer 111, 112 may comprise a high-k dielectric material such as $HfO_2$, $ZrO_2$, $Al_2O_3$, $TiO_2$, $La_2O_3$, $SrTiO_3$, $LaAlO_3$, hafnium silicates, barium-strontium-titanates (STs), lead-zircon-titanates (PZTs), or organic high-k dielectrics. Via the first and second gate dielectric layer 111, 112 respectively the bottom 121 and top gate electrodes, 131, 132 are capacitively coupled to the BLG, i.e. to the first and the second graphene layer 101, 102 respectively.

The BLG device contains three gate electrodes: one bottom gate electrode 121 and two top gate electrodes 131,132. The top gate electrodes 131, 132 are spaced apart from each other by a horizontal distance D1. Distance D1 should not be lower than 10 nm in order to avoid leakage problems. The BLG device is preferably a sub-100 nm device. The length of the BLG is preferably smaller than 100 nm.

Due to the placement of the bottom 121 and top gate electrodes 131, 132 relative to each other, four regions may be defined for the BLG semiconductor device: a source region 150, a barrier region 151, a channel region 140 and a drain region 160. The source region 150 is adjacent the barrier region 151. The barrier region 151 is adjacent the channel region 140 and the channel region 140 is adjacent the drain region 160. The source region 150 is that part of the BLG which is sandwiched in between the bottom gate electrode 121 and the second top gate electrode 132. The channel region 140 is that part of the BLG which is sandwiched in between the bottom gate electrode 121 and the first top gate electrode 131. The barrier region 151 is in between the source region 150 and the channel region 140 and is that part of the BLG that is only contacted (or capacitively coupled)/overlapped by bottom gate electrode 121. The barrier region 151 has thus a width equal to spacing D1 between the first 131 and the second 132 top gate electrode. The drain region 160 is that part of the BLG that is only contacted by (or capacitively coupled to) the bottom gate electrode 121. The top gate electrodes 131, 132 may be biased by top gate electrode contacts 231, 232. The bottom gate electrode 121 may be biased by a bottom gate electrode contact 221. Top and bottom gates may be biased separately.

Figure 6:
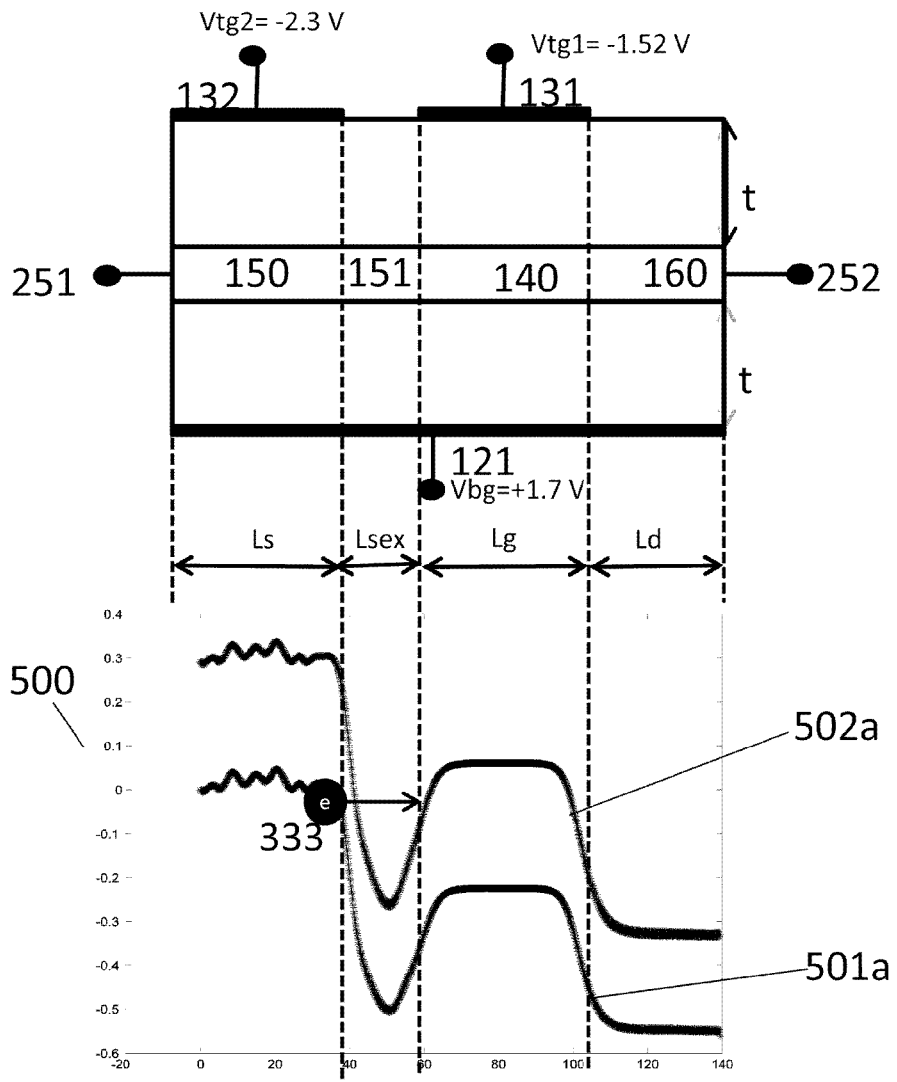
FIG. 6 shows schematically a biased BLG TFET according to embodiments of the third aspect (top) and the corresponding band diagram scheme of the BLG TFET (bottom) in the OFF state.

FIG. 6 shows schematically (top) a biased BLG semiconductor device according to the second example and (bottom) the corresponding band diagram scheme of the BLG in the OFF state. As the device is OFF, no current can flow from the source region 150 via the barrier region and the channel region 140 to the drain region 160. The band diagram scheme 500 shows the energy levels of the valence band 501 of the BLG and the conduction band 502 of the BLG over the total distance of the BLG device, i.e., over the source region 150, the barrier region 151, the channel region 140 and the drain region 160. This biasing scheme divides the valence band 501a and conduction band 502a into four regions along the charge transport direction (i.e. the longitudinal direction): (I) an n-type region which defines the source 150, (II) an p-type region which defines the barrier region 151, (III) an intrinsic region which defines the channel 140 and (IV) an p-type region which defines the drain 160. By biasing the bottom 112 gate electrode and the top 131, 132 gate electrode, electrically doped regions may be induced in the chemically undoped BLG 103.

In the OFF state, the bottom gate electrode 121 is biased according to a first polarity, for example positively (V(BG)=+1.7V), whereas the second top gate electrode 132 is biased with a an opposite polarity compared to the first polarity, for example a voltage oppositely to and with an absolute value that is higher than the bias applied to the bottom gate electrode 121 (V(TG2)1=−2.3V): V(BG)>V(TG2). The first top gate electrode 131 is also biased with an opposite polarity compared to the first polarity, but with a voltage oppositely to and with an absolute value close to the bottom gate electrode 121 (V(TG1)=−1.52V). In the OFF state carriers 333 cannot flow through the channel region. It should be noted that a person skilled in the art could easily adapt the signs of the voltage such that opposite doping types are induced in the BLG, i.e. p-type source region, n-type barrier, intrinsic channel region and n-type drain region.

Figure 7:
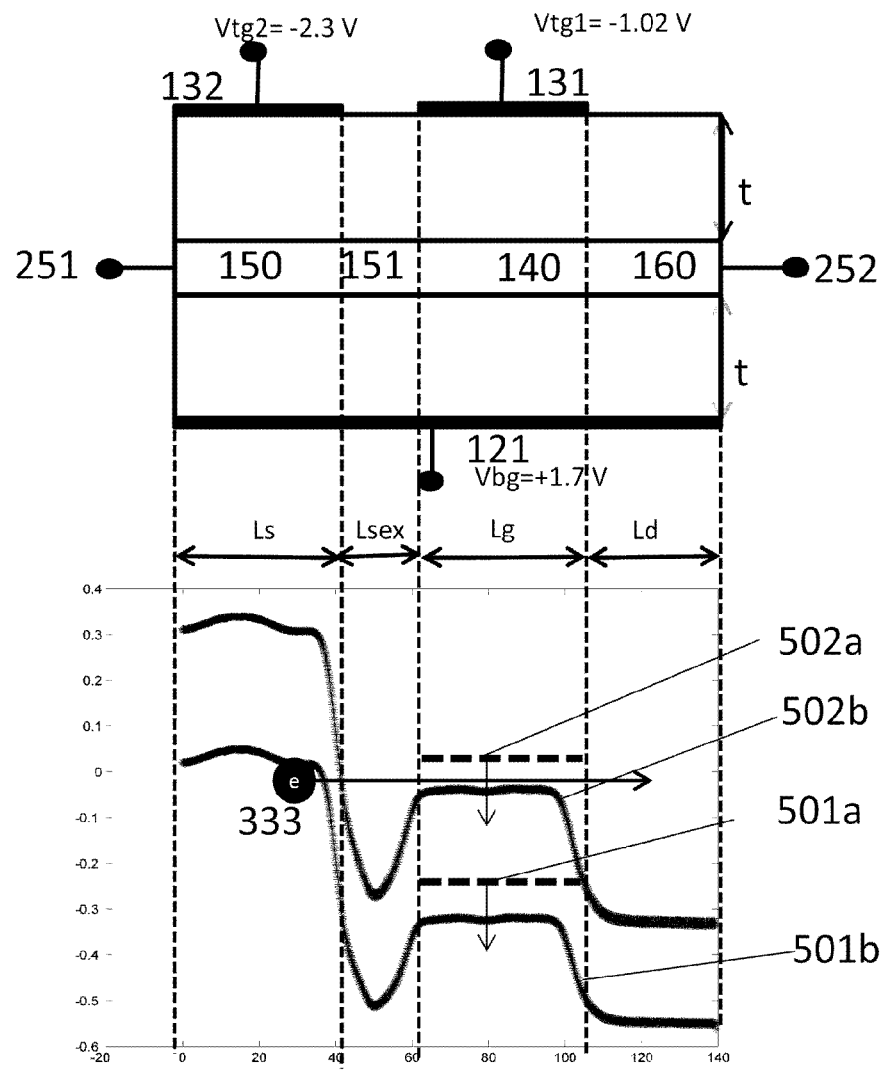
FIG. 7 shows schematically a biased BLG TFET according to embodiments of the third aspect (top) and the corresponding band diagram scheme of the BLG TFET (bottom) in the ON state.

FIG. 7 shows schematically a biased BLG semiconductor device according to embodiments of the third aspect (top) and the corresponding band diagram scheme of the BLG (bottom) in the ON state.

In the ON state, the first top gate electrode contact 131 is additionally biased by a positive supply voltage Vdd. The voltage applied to the first top gate electrode contact 131 becomes thus less negative compared to the bias applied to this gate in the OFF state. The second top gate electrode 132 and the bottom gate electrode 121 remain biased with the same value as in the OFF state. Due to the additional supply voltage Vdd, the conduction band 502a and valence band 501a are lowered to the conduction 502b and valence band 501b in the ON state. The higher the supply voltage Vdd, the more the valence and conduction bands in region 140 will move downwards.

The additional supply voltage Vdd in the ON state divides the valence 501 band and conduction 502 band into four regions along the charge transport direction (i.e. the longitudinal direction): (I) the source region 150 remains n-type, (II) the barrier region 151 remains p-type, (III) the channel 140 now becomes p-type and, (IV) the drain region 160 remains p-type. In the ON state carriers 333 can flow through the channel region 140 as the valence 501b band and conduction 502b bands have been lowered compared to the valence 501a band and conduction 502a band in the OFF state when applying an additional supply voltage to the first gate electrode. Thus by applying an additional supply voltage Vdd to the first top gate electrode 131 the intrinsic channel region may be converted into a doped channel region (p-type or n-type depending on the polarity of the voltages applied), with same doping type as the barrier region 151 and the drain region 160.

Figure 8:
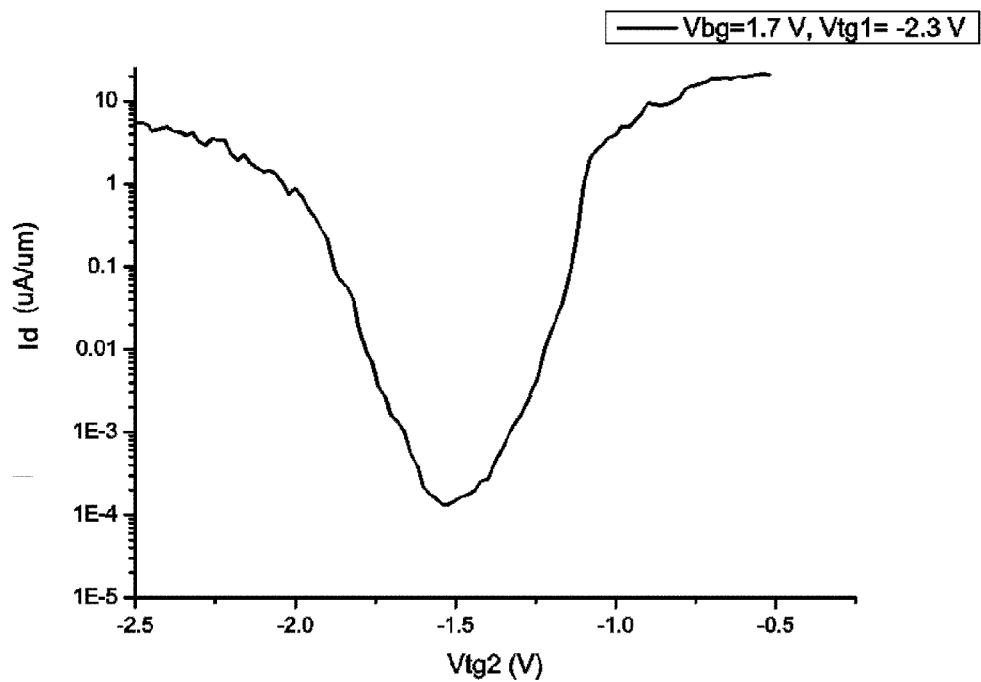
FIG. 8 shows the transfer characteristics for a BLG TFET according embodiments of the third aspect in the ON-state.
Figure 9:
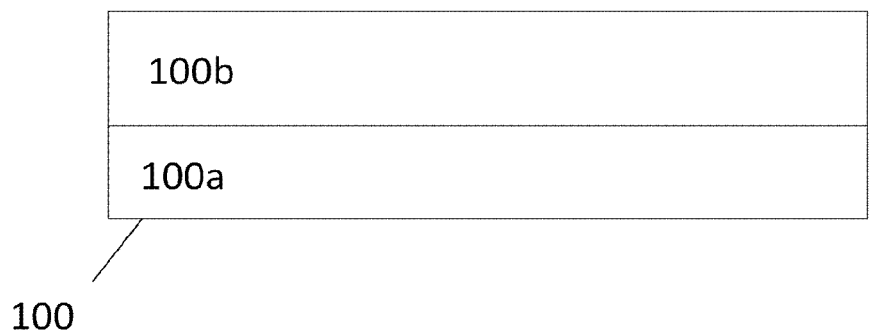
FIGS. 9-15 show schematically different steps of a method for manufacturing a BLG TFET of the first aspect according to a fifth aspect.
Figure 10:
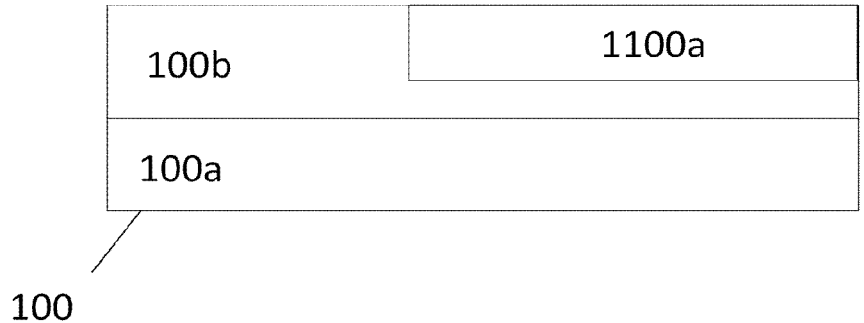
Figure 11:
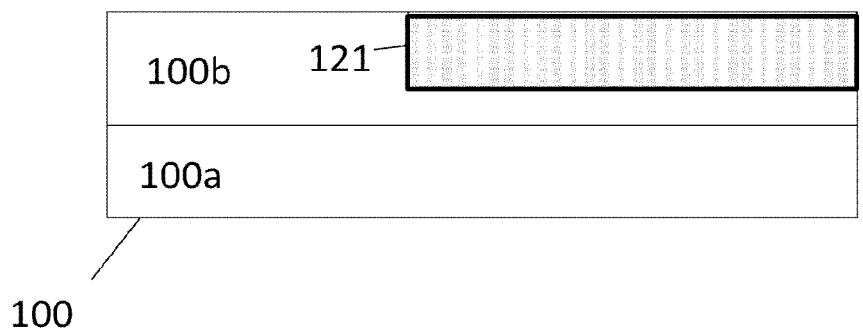
Figure 12:
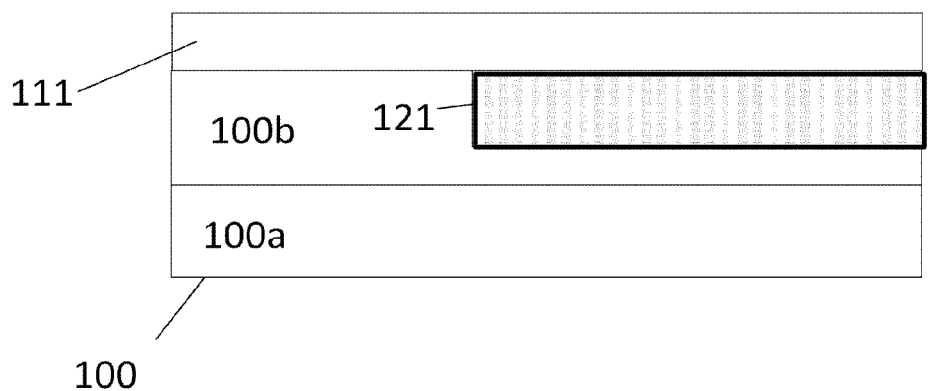
Figure 13:
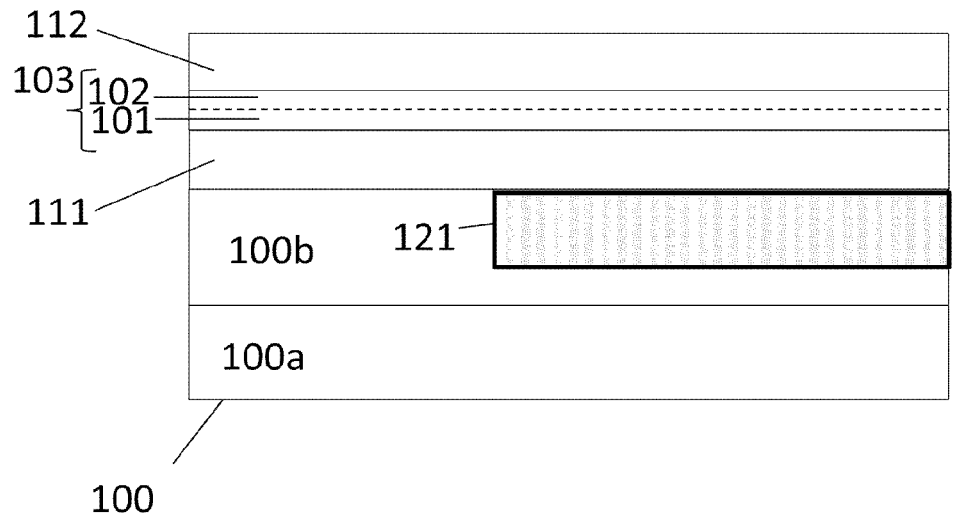
Figure 14:
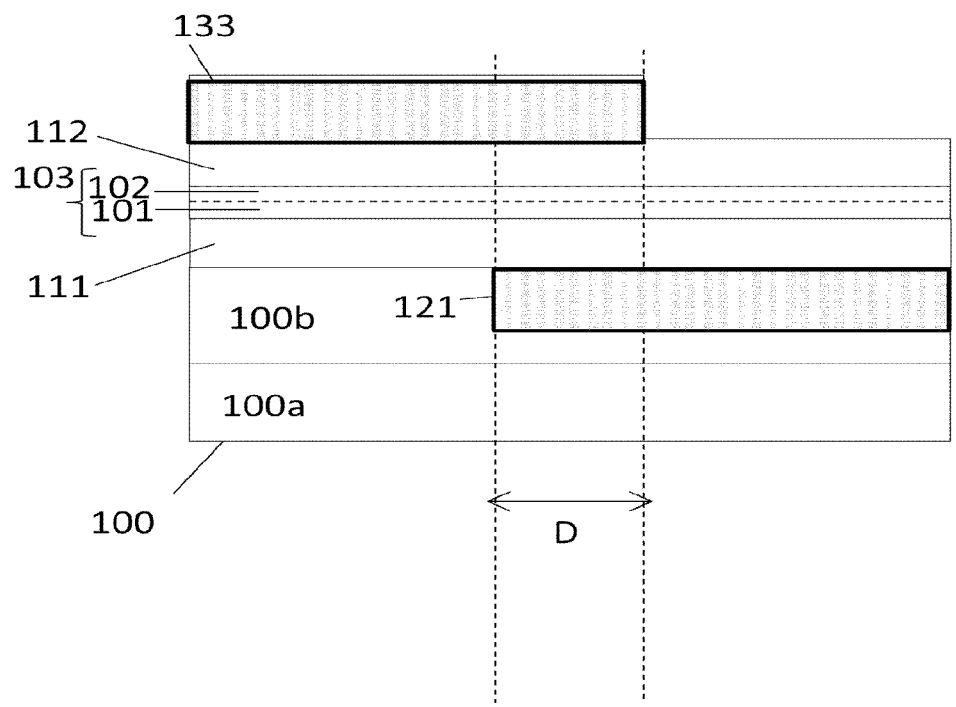

FIG. 8 shows the transfer characteristics for a BLG semiconductor device of FIG. 7. The drain current (Id) is plotted as function of the voltage applied to the first top gate electrode 131 (Vtg1) with a constant bottom gate bias (Vbg)) of 1.7V and a constant voltage (Vtg2) of −2.3V applied to the second top gate electrode 132. The length of the bottom gate electrode 121 is 160 nm and of the first and second top gate electrode 131, 132 is 40 nm each. There is a distance of about 40 nm in between the first and second top gate electrode 131, 132. The device offers an on-current $I_{ON}$ of more than 10 µA/µm for a source-drain voltage $V_{ds}$ of 10 mV. The $I_{ON}/I_{OFF}$ ratio is around $10^5$.

FIGS. 9-15 show schematically different steps of a method for manufacturing a bilayer graphene device according to an embodiment of the first/third aspect.

In a first step (FIG. 9) a substrate 100 is provided. The substrate comprises preferably a semiconductor layer 100a and a bottom dielectric layer 100b on top of the semiconductor layer 100a. The substrate may comprise for example a $SiO_2$ layer on top of a Si layer.

In a next step (FIG. 10) a trench 1100a is provided in the bottom dielectric layer 100b. This trench is preferably formed using standard patterning and etching techniques such as a combination of lithography and etching. The trench 1100a and its dimensions define the dimensions of the bottom gate electrode. The total BLG device dimension is preferably sub-100 nm.

In a next step (FIG. 11) the trench 1100a is filled with conducting gate material as such providing the bottom gate electrodes 121. The conducting bottom gate material deposition may be done using standard metal deposition techniques. The conducting bottom gate material may comprise poly-Si, or a metal such as for example TaN, TiN, or the like.

In a following step (FIG. 12) the first gate dielectric layer 111 is provided on the bottom gate electrode and on the bottom dielectric layer 100b. The first gate dielectric layer 111 preferably comprises a high-k material and may be deposited using standard techniques known for a person skilled in the art such as for example atomic layer deposition (ALD).

Thereafter (FIG. 13) a bilayer graphene 103 is formed on the first gate dielectric layer 111 and a second gate dielectric layer 112 is formed on the bilayer graphene 103. The bilayer graphene 103 may be formed for example by transfer. Other well-known processes for forming a bilayer graphene may be used by those skilled in the art. The second gate dielectric layer 112 preferably comprises a high-k material and may be deposited using standard techniques known for a person skilled in the art such as for example atomic layer deposition (ALD).

Figure 15:
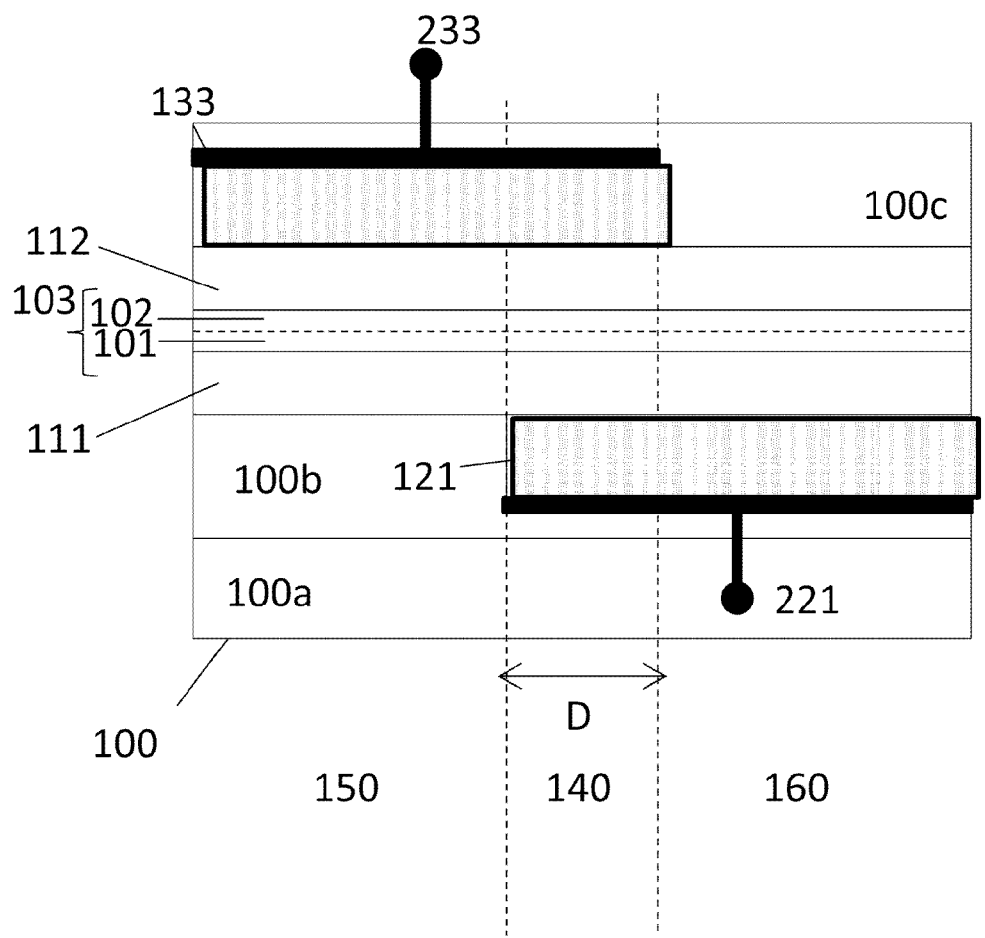

Thereafter (FIG. 14) the top gate electrode 133 is formed by depositing conducting top gate material and patterning the metal material. Furthermore gate contacts 233, 221 may be provided and a dielectric material 100c may be provided on top of the top gate electrode 133 (FIG. 15).

Depending on the positioning of the different bottom gate electrodes and/or top gate electrodes different configurations for the BLG device are possible. However a person skilled in the art may easily adapt the above described manufacturing flow to the different configurations. For example two top gate electrodes may be provided by techniques known for a person skilled in the art, such as depositing a patterned gate layer on the second gate dielectric layer 112.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A bilayer graphene tunnelling field effect transistor, comprising:
    a bilayer graphene having a bottom surface and a top surface;
    a bottom gate electrode capacitively coupled to the bottom surface of the bilayer graphene;
    a first top gate electrode capacitively coupled to the top surface of the graphene bilayer; and
    a second top gate electrode capacitively coupled to the top surface of the bilayer graphene and spaced apart along the top surface from the first top gate electrode, whereby the bottom gate electrode fully overlaps the first top gate electrode and the second top gate electrode, thereby defining a channel region capacitively coupled to the bottom gate electrode and the first top gate electrode, a source region capacitively coupled to the second top gate electrode and the bottom gate electrode, a barrier region only capacitively coupled to the bottom gate electrode, and a drain region only capacitively coupled to the bottom gate electrode.

2. The bilayer graphene tunnelling field effect transistor of claim 1, further comprising a first gate dielectric layer on a substrate, wherein the bilayer graphene comprises a first graphene layer and a second graphene layer, wherein the first graphene layer and the second graphene layer are adjoining, the bilayer graphene being sandwiched in between with the first gate dielectric layer and a second gate dielectric layer, the first gate dielectric layer contacting the first graphene layer and the second gate dielectric layer contacting the second graphene layer, and the top gate electrode contacting the second gate dielectric layer opposite to the second graphene layer.

3. The bilayer graphene tunnelling field effect transistor of claim 1, wherein the bottom gate electrode is embedded in a substrate, wherein the substrate comprises a semiconductor layer with a bottom dielectric layer on top, wherein the bottom gate electrode is embedded in the bottom dielectric layer, wherein the bottom gate electrode has a top surface and the bottom dielectric layer has a top dielectric surface, and wherein the top surface of the bottom gate electrode is coplanar with the top dielectric surface of the bottom dielectric layer.

4. A bilayer graphene tunnelling field effect transistor, comprising:
    a bilayer graphene having a bottom surface and a top surface;
    a bottom gate electrode capacitively coupled to the bottom surface of the bilayer graphene; and
    a first top gate electrode capacitively coupled to the top surface of the graphene bilayer,
    wherein the bottom gate electrode at least partially overlaps the first top gate electrode, thereby defining a channel region capacitively coupled to the bottom gate electrode and the first top gate electrode, a source region only capacitively coupled to the top gate electrode, and a drain region only capacitively coupled to the bottom gate electrode, wherein the top gate electrode is covered by a top dielectric layer and wherein the drain region is sandwiched in between the bottom gate electrode and a part of the top dielectric layer.

5. The bilayer graphene tunnelling field effect transistor of claim 1, further comprising a different contact for each of the at least a top and a bottom gate electrode configured to separately bias each of the at least a top and a bottom gate electrode.

6. The bilayer graphene tunnelling field effect transistor of claim 2, wherein the first and second gate dielectric layers have a same equivalent oxide thickness.

7. The bilayer graphene tunnelling field effect transistor of claim 2, further comprising a second top gate electrode capacitively coupled to the top surface of the bilayer graphene and spaced apart along the top surface from the first top gate electrode, wherein the bottom gate electrode fully overlaps the first top gate electrode and the second top gate electrode, thereby defining a channel region capacitively coupled to the bottom gate electrode and the first top gate electrode, a source region capacitively coupled to the second top gate electrode and the bottom gate electrode, a barrier region only capacitively coupled to the bottom gate electrode, and a drain region only capacitively coupled to the bottom gate electrode, wherein the transistor comprises a first top gate electrode and a second top gate electrode and wherein both the first top gate electrode and the second top gate electrode contact the second gate dielectric layer opposite to the second graphene layer.

8. The bilayer graphene tunnelling field effect transistor of claim 1, wherein the bilayer graphene layer is chemically undoped.

9. A bilayer graphene tunnelling field effect transistor, comprising:
    a bilayer graphene having a bottom surface and a top surface;
    a bottom gate electrode capacitively coupled to the bottom surface of the bilayer graphene; and
    a first top gate electrode capacitively coupled to the top surface of the graphene bilayer,
    wherein the bottom gate electrode at least partially overlaps the first top gate electrode, thereby defining a channel region capacitively coupled to the bottom gate electrode and the first top gate electrode, a source region only capacitively coupled to the top gate electrode, and a drain region only capacitively coupled to the bottom gate electrode, wherein a p-i-n junction or n-i-p junction is electrostatically induced in the bilayer graphene.

10. The bilayer graphene tunneling field effect transistor of claim 9, wherein the p-i-n junction or an n-i-p junction is electrostatically induced by applying a voltage to a top gate electrode and a voltage of opposite sign to the bottom gate electrode.

11. The bilayer graphene tunneling field effect transistor of claim 1, wherein a p-i-n junction or n-i-p junction is electrostatically induced in the bilayer graphene.

12. The bilayer graphene tunneling field effect transistor of claim 11, wherein the p-n-i-n junction or n-p-i-p junction is electrostatically induced by applying a constant bias Vbg to the bottom gate electrode, applying a bias Vtg2 of opposite sign to Vbg, wherein |Vtg2|>|Vbg|, to the second top gate electrode to create the p-type source region, and applying a voltage Vtg1 of opposite sign to Vbg to the first top gate electrode to create an intrinsic channel region in the bilayer graphene, wherein |Vtg1| is substantially equal to |Vbg| when measured in absence of applied drain-source voltage $V_{ds}$.

13. The bilayer graphene tunnelling field effect transistor of claim 4, further comprising a first gate dielectric layer on a substrate, wherein the bilayer graphene comprises a first graphene layer and a second graphene layer, wherein the first graphene layer and the second graphene layer are adjoining, the bilayer graphene being sandwiched in between with the first gate dielectric layer and a second gate dielectric layer, the first gate dielectric layer contacting the first graphene layer and the second gate dielectric layer contacting the second graphene layer, and the top gate electrode contacting the second gate dielectric layer opposite to the second graphene layer.

14. The bilayer graphene tunnelling field effect transistor of claim 4, wherein the bottom gate electrode is embedded in a substrate, wherein the substrate comprises a semiconductor layer with a bottom dielectric layer on top, wherein the bottom gate electrode is embedded in the bottom dielectric layer, wherein the bottom gate electrode has a top surface and the bottom dielectric layer has a top dielectric surface, and wherein the top surface of the bottom gate electrode is coplanar with the top dielectric surface of the bottom dielectric layer.

15. The bilayer graphene tunnelling field effect transistor of claim 4, further comprising a different contact for each of the at least a top and a bottom gate electrode configured to separately bias each of the at least a top and a bottom gate electrode.

16. The bilayer graphene tunnelling field effect transistor of claim 4, wherein the bilayer graphene layer is chemically undoped.

17. The bilayer graphene tunnelling field effect transistor of claim 9, further comprising a first gate dielectric layer on a substrate, wherein the bilayer graphene comprises a first graphene layer and a second graphene layer, wherein the first graphene layer and the second graphene layer are adjoining, the bilayer graphene being sandwiched in between with the first gate dielectric layer and a second gate dielectric layer, the first gate dielectric layer contacting the first graphene layer and the second gate dielectric layer contacting the second graphene layer, and the top gate electrode contacting the second gate dielectric layer opposite to the second graphene layer.

18. The bilayer graphene tunnelling field effect transistor of claim 9, wherein the bottom gate electrode is embedded in a substrate, wherein the substrate comprises a semiconductor layer with a bottom dielectric layer on top, wherein the bottom gate electrode is embedded in the bottom dielectric layer, wherein the bottom gate electrode has a top surface and the bottom dielectric layer has a top dielectric surface, and wherein the top surface of the bottom gate electrode is coplanar with the top dielectric surface of the bottom dielectric layer.

19. The bilayer graphene tunnelling field effect transistor of claim 9, further comprising a different contact for each of the at least a top and a bottom gate electrode configured to separately bias each of the at least a top and a bottom gate electrode.

20. The bilayer graphene tunnelling field effect transistor of claim 9, wherein the bilayer graphene layer is chemically undoped.

* * * * *